United States Patent
Hikata et al.

(10) Patent No.: US 6,357,105 B1
(45) Date of Patent: *Mar. 19, 2002

(54) OXIDE SUPERCONDUCTING WIRE

(75) Inventors: Takeshi Hikata; Hidehito Mukai; Kenichi Sato, all of Osaka (JP)

(73) Assignee: Sumitomo Electric Industries, Ltd. (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/999,675

(22) Filed: Oct. 14, 1997

Related U.S. Application Data

(62) Division of application No. 08/316,292, filed on Sep. 29, 1994, now abandoned, which is a continuation of application No. 07/981,580, filed on Nov. 20, 1992, now abandoned, which is a continuation of application No. 07/469,224, filed on Jan. 24, 1990, now abandoned.

(30) Foreign Application Priority Data

Jan. 26, 1989 (JP) ................................................ 1-19314
Mar. 1, 1989 (JP) ................................................ 1-49463

(51) Int. Cl.$^7$ ................................................ H01L 39/24
(52) U.S. Cl. .................. 29/599; 505/100; 505/230; 505/231; 505/232; 505/430; 505/431; 505/432
(58) Field of Search ................................ 29/599; 505/430, 505/431, 432, 433, 230, 231, 232

(56) References Cited

U.S. PATENT DOCUMENTS

| | | | | |
|---|---|---|---|---|
| 4,929,596 A | * | 5/1990 | Meyer et al. | 29/599 X |
| 5,045,527 A | * | 9/1991 | Ikeno et al. | 505/433 X |
| 5,168,127 A | * | 12/1992 | Kohno et al. | 505/232 |
| 5,283,232 A | * | 2/1994 | Kohno et al. | 29/599 X |

* cited by examiner

Primary Examiner—Carl J. Arbes
(74) Attorney, Agent, or Firm—Pennie & Edmonds LLP

(57) ABSTRACT

An oxide superconducting wire of an anisotropic oxide superconductor comprises a core part of the wire and a superconducting layer enclosing the core part so that specific crystal axes of the oxide superconductor are oriented toward the core part. A method of producing a wire of an anisotropic oxide superconductor comprises the steps of arranging a metal sheath around a metal rod for forming a core part of the wire and charging powder of the oxide superconductor in a clearance between the metal sheath and the metal rod for preparing a composite material, and plastically working the composite material so that the metal sheath is larger in reduction of area than the metal rod.

12 Claims, 3 Drawing Sheets

OXIDE SUPERCONDUCTING WIRE

This is a division of application Ser. No. 08/316,292, filed Sep. 29, 1994, now abandoned which is a continuation of application Ser. No. 07/981,580 filed on Nov. 20, 1992, now abandoned which is a continuation of application Ser. No. 07/469,224, filed on Jan. 24, 1990, now abandoned.

BACKGROUND OF THE INVENTION

1. Field of the Invention

The present invention relates to a superconducting wire, and more particularly, it relates to a superconducting wire which is prepared from an oxide superconductor.

2. Description of the Background Art

It has recently been reported that a composite oxide sintered body superconducts at a high critical temperature, and an attempt has been made to develop a superconductivity technique through such a superconductor. It has been reported that a YBaCuO oxide exhibits superconductivity at 90 K and BiPbSrCaCuO oxide exhibits superconductivity at 110 K.

Such an oxide superconductor exhibits superconductivity in liquid nitrogen, which can be easily obtained at a relatively low cost, and hence the same is expected for practical use. In order to apply the oxide superconductor to the wire of a superconducting magnet, for example, it is necessary to work the same into a wire. However, it is known that such an oxide superconductor is anisotropic, and hence the crystals thereof must be oriented in a specific direction in order to attain high critical current density ($J_C$) In general, powder of the oxide superconductor is charged in a metal sheath, drawn into a wire having a prescribed diameter, and thereafter worked by rolling or pressing to obtain a tape-type wire, in which crystals of the oxide superconductor are oriented in a prescribed direction.

However, the oxide superconductor has such anisotropy that its critical current density is extremely varied with the direction of an applied magnetic field. Thus, it is known that critical current density is significantly varied with a magnetic field which is applied in parallel to the tape surface and that applied perpendicularly to the tape surface in a tape-type wire of an oxide superconductor whose crystals are oriented in a prescribed direction. For example, the wire exhibits critical current density of about 1000 A/cm$^2$ when a magnetic field of 1 T is applied in parallel to the tape surface, while the current hardly flows in the case of a perpendicular magnetic field. When such a conventional tape-type wire is coiled to provide a superconducting magnet, the generated magnetic field is applied in different directions depending on a location of a wire portion in the coil, to cause difference in critical current density within the wire. The critical current density of the overall wire is dominated by portions having lower critical current density. Thus, it is impossible to attain high critical current density as a whole.

It is known that a magnetic flux enters the interior of an oxide superconductor before the superconductor goes into an ordinary conducting state. This magnetic flux is unmovably fixed by "pinning", and it is necessary to improve such pinning force in order to attain high critical current density.

However, no contrivance has been made to improve the pinning force in the prior art oxide superconducting wire, and hence it has been impossible to attain high critical density.

SUMMARY OF THE INVENTION

A principal object of the present invention is to provide an oxide superconducting wire which can regularly keep constant critical current density regardless of the direction of application of a magnetic field, and a method of producing the same.

Another object of the present invention is to provide a superconducting wire having higher critical current density by improving pinning force.

The present invention provides a wire of an anisotropic oxide superconductor, which comprises a core part of the wire and a superconducting layer enclosing the core part so that specific crystal axes of the oxide superconductor are oriented toward the core part.

According to the present invention, the anisotropic oxide superconductor is not particularly restricted but may be prepared from a BiPbSrCaCuO oxide or a YBaCuO oxide, for example. The present invention is applicable to most of oxide superconductors since most of oxide superconducting wires are considered anisotropic in view of current flowability etc.

The inventive method of producing a superconducting wire comprises a step of arranging a metal sheath around a metal rod for serving as a core part of the wire and charging powder of an oxide superconductor in a clearance between the metal sheath and the metal rod to obtain a composite material, and a step of plastic deformation of the composite material so that the metal sheath is larger in reduction of area than the metal rod.

In order to plastically work the composite material so that the metal sheath is larger in reduction of area than the metal rod, the metal sheath and the metal rod are prepared from materials which are different in workability from each other, for example. In other words, the metal rod is prepared from an relatively unworkable metal, and the metal sheath is prepared from a relatively workable metal. Due to such selection of the materials, it is possible to make higher reduction of area of the metal rod while making lower that of the metal sheath. When the oxide superconductor is prepared from a BiPbSrCaCuO oxide, for example, the metal sheath is formed of Ag, which is unreactive with the oxide superconductor, and the metal rod is formed of a metal such as Ni, for example, which is inferior in workability of Ag. In this case, the surface of the metal rod is preferably covered with Ag or the like, so that Ni is not reactively in contact with the oxide superconductor.

The metal rod and the metal sheath may be prepared from the same metal while devising the method of plastic working so that the metal sheath is larger in reduction of area than the metal rod.

The plastic working method is not particularly restricted in the present invention, while wire drawing, rolling or swaging may be employed.

According to the present invention, the superconducting wire may have one or more core parts. A plurality of core parts may be provided in multi-core structure such as that of a conventional metallic superconducting wire.

According to the inventive oxide superconducting wire, a superconducting layer is provided around the core part so that specific crystal axes of the oxide superconductor are oriented toward the core part. Therefore, the superconducting layer contains such crystals of the oxide superconductor that specific crystal axes are oriented in directions which are different by 360° from each other. Thus, any portion of the superconducting layer necessarily contains crystals of the oxide superconductor which exhibit the highest critical current density with respect to the applied magnetic field. In the inventive oxide superconducting wire, therefore, portions having high critical current density regularly exist in series along the longitudinal direction of the wire even if the magnetic field is partially applied in different directions. Thus, high critical current density can be maintained as a whole.

According to the inventive method, the composite material is so plastically worked that the metal sheath is higher in reduction of area than the metal rod. Due to such plastic working, a clearance between the metal sheath and the metal rod is gradually reduced in thickness to compress the powder of the oxide superconductor which is charged in this clearance. Through such compression, the powder of the oxide superconductor is subjected to force which is similar to that for the conventional tape-type wire, and oriented in a prescribed direction. For example, an oxide superconductor which is prepared from a BiPbSrCaCuO oxide is cloven along the c-plane, and hence the c-axes, which are perpendicular to the c-plane, are oriented toward the core part. The BiPbSrCaCuO oxide superconductor has the highest critical current density along the direction of the c-plane, and the wire is so produced as to orient the oxide superconductor in this direction. As hereinabove described, the superconducting layer is so formed as to orient the c-axes toward the core part in the radial section of the wire, which is necessarily provided with portions having the highest critical current density with respect to any direction of application of the magnetic field. Thus, the portions having the highest critical current density are adapted to transport the current in the high magnetic field, to regularly ensure high critical current density regardless of the direction of the applied magnetic field.

The inventive superconducting wire has no dependency on the direction of application of the magnetic field, but exhibits high critical current density with respect to any direction.

According to the inventive method, a superconducting wire exhibiting high critical current density can be produced through simple steps in high productivity.

The inventive oxide superconducting wire having the aforementioned advantages is usefully employed under a strong magnetic field particularly for a superconducting magnet having complicated field distribution.

According to one aspect of the present invention, the oxide superconducting layer provided around the central part is divided into a plurality of layers so as to increase boundaries between the oxide superconductor and a matrix as well as to increase pinning points, thereby improving pinning force. According to this aspect, the oxide superconducting layers are brought into configurations elongated along the circumferential direction as compared with the radial direction. In the working step, therefore, force is applied to the oxide superconducting layers perpendicularly to the circumferential direction, whereby the oxide superconducting layers are oriented along the longitudinal direction to facilitate flow of the current.

According to this aspect, preferably, high-resistance layers of a material having high electrical resistance are interposed between the plurality of oxide superconducting layers. When an alternating current is fed, a coupled current flows through a matrix layer provided between each adjacent pair of oxide superconducting layers. This coupled current results in a loss when carrying ac. In order to reduce such a loss, therefore, it is necessary to minimize the coupled current. According to this preferred embodiment, the high resistance layers of the material having high electrical resistance are interposed between the plurality of oxide superconducting layers to reduce the coupled current, thereby reducing the loss caused when carrying ac.

The material for the high-resistance layers may be prepared from a metal, ceramic or the like. When the matrix metal is prepared from silver, for example, a silver alloy or stainless steel may be employed as the material for the high-resistance layers. Such a material can also improve the strength of the matrix.

These and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE 1

Figure 1:
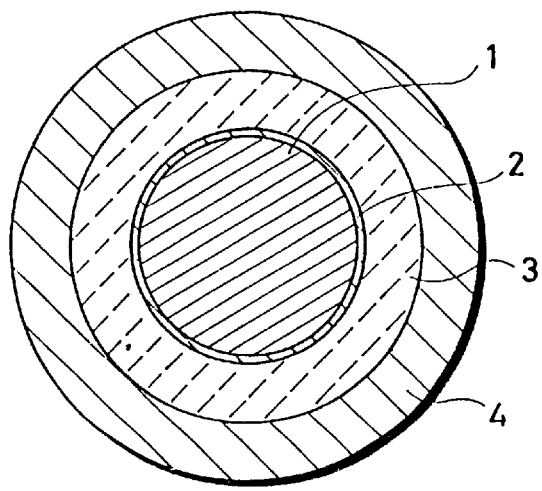
FIG. 1 is a sectional view showing Example of the present invention.

Oxide powder materials were mixed so that Bi, Pb, Sr, Ca and Cu were in the ratios 1.8:0.4:2:2.3:3. This mixed powder was calcined twice at 800° C. and once at 860° C. An Ni rod of 3 mm in diameter, whose surface was covered with an Ag layer of 0.5 mm in thickness, was inserted in an Ag pipe of 8 mm in inner diameter and 12 mm in outer diameter, and the calcined and pulverized oxide powder was charged in a clearance therebetween, to obtain a composite material. This composite material was plastically worked into a wire of 3 mm in diameter through drawing and swaging. The plastically worked wire was subjected to heat treatment at 840° C. for 100 hours, further plastically worked to a diameter of 2 mm, and again subjected to heat treatment at 840° C. for 50 hours. FIG. 1 is a sectional view showing the superconducting wire thus obtained. Referring to FIG. 1, numeral 1 denotes a core part, which was obtained by plastically working the Ni rod. Numeral 2 denotes a core part covering layer, i.e., the Ag layer covering the Ni rod. Numeral 3 denotes a superconducting layer, and numeral 4 denotes an outer covering layer, which was obtained by plastically working the Ag metal pipe.

Figure 2:
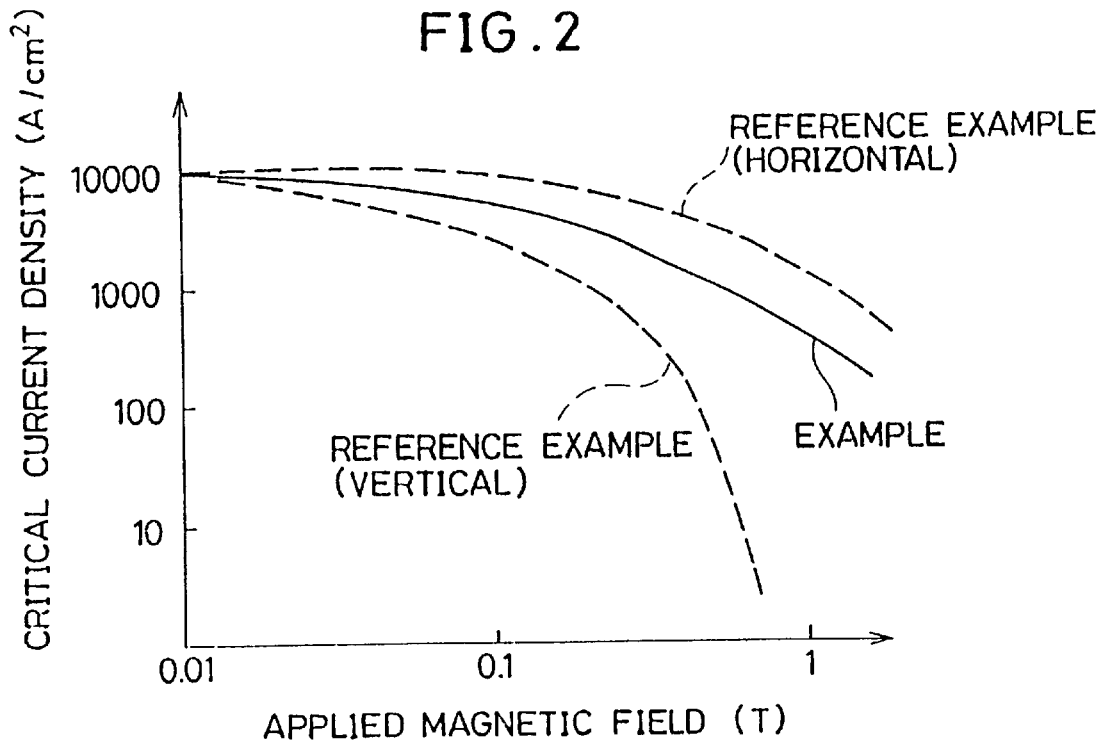
FIG. 2 illustrates the relation between a magnetic field applied to the oxide superconducting wire according to the Example shown in FIG. 1 and critical current density.

A magnetic field was applied to this superconducting wire, to measure the relation between the applied magnetic field and critical current density ($J_c$), as shown in FIG. 2. FIG. 2 also shows relations between magnetic fields which were applied to conventional tape-type wires, similarly prepared through BiPbSrCaCuO superconductors, vertically and horizontally to the tape surfaces and critical current density values.

As understood from FIG. 2, the superconducting wire according to the present invention exhibited higher critical current density as compared with the conventional tape-type wire also in a high magnetic field. Further, no change was caused in the relation between the applied magnetic field and the critical current density when the direction of application of the magnetic field was changed. Thus, it has been confirmed that the inventive superconducting wire is not anisotropic.

EXAMPLE 2

Figure 3:
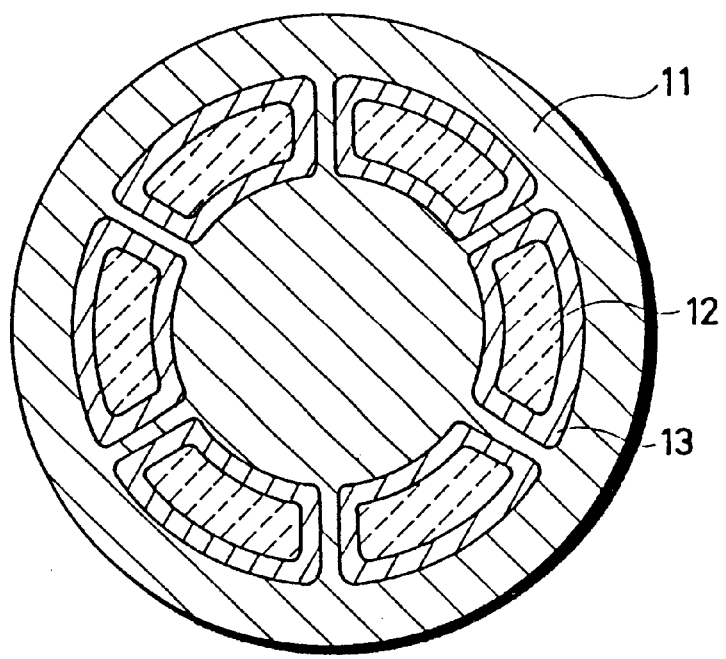
FIG. 3 is a sectional view showing a preferred mode of the present invention.

FIG. 3 is a sectional view showing a preferred mode of the present invention. Referring to FIG. 3, a plurality of oxide superconducting layers 12 are dividedly provided around a central part. High-resistance layers 13 are provided around the oxide superconducting layers 12. Such high-resistance layers 13 are interposed between a matrix 11 and the oxide superconducting layers 12. Thus, the high-resistance layers 13 are necessarily interposed between adjacent pairs of the oxide superconducting layers 12, to increase electrical resistance therebetween and to reduce the coupled current which is caused when carrying ac.

EXAMPLE 3

Example according to the aforementioned preferred mode is now described.

Powder materials of $Bi_2O_3$, PbO, $SrCO_3$, $CaCO_3$ and CuO of not more than 1 µm in particle size were mixed with each other so that Bi, Pb, Sr, Ca and Cu were in the ratios 1.8:0.4:2:2.2:3. This mixture was calcined twice at 800° C., sintered at 860° C., and then pulverized to obtain powder. This powder was charged in a silver pipe of 10 mm in inner diameter and 12 mm in outer diameter, and drawn into a wire of 4 mm in diameter. This wire was inserted in a silver-palladium alloy pipe of 4 mm in inner diameter and 5 mm in outer diameter, and worked into a rectangular wire having a sectional curvature. The silver-palladium alloy pipe was adapted to form high-resistance layers in the final superconducting wire.

The rectangular wire was inserted in a silver pipe of 6 mm in inner diameter and 8 mm in outer diameter, while a silver rod was inserted in its center. This substance was wire-drawn to a diameter of 3 mm, sintered at 845° C. for 50 to 200 hours, further wire-drawn to a diameter of 1.5 mm and again sintered at 845° C. for 50 hours.

Figure 4:
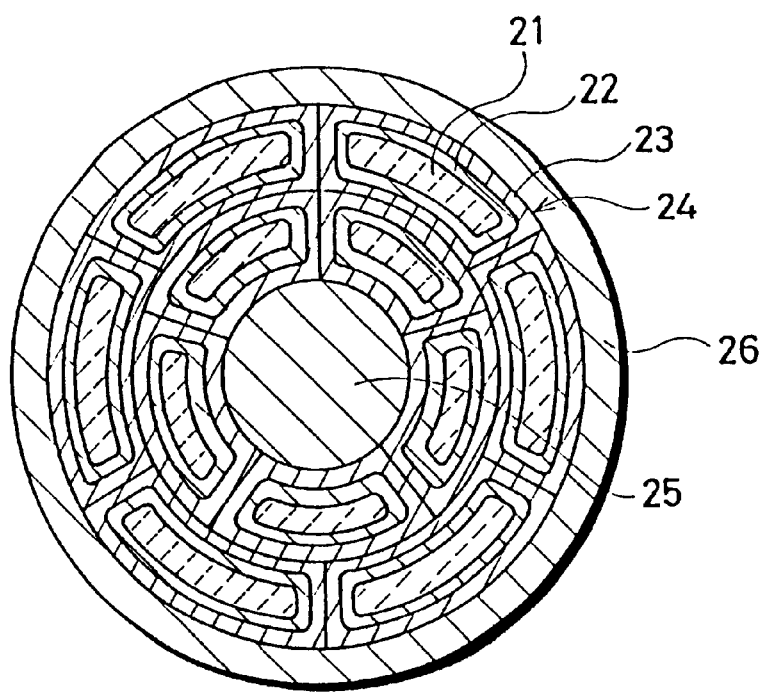
FIG. 4 is a sectional view showing Example according to the preferred mode of the present invention.

FIG. 4 is a sectional view showing the wire thus obtained. As shown in FIG. 4, the silver rod formed a central part 25 at the center of the wire, while five sectorial rectangular wires 24 were provided around the central part 25. Oxide superconducting layers 21 were located within the sectorial rectangular wires 24, while matrix layers 22, which were formed from the silver sheath, were located around the oxide superconducting layers 21. High-resistance layers 23 were formed from the silver-palladium alloy sheath around the matrix layers 22. Six second sectorial rectangular wires were arranged to enclose the first sectorial rectangular wires 24, while an outermost layer 26 of a silver sheath was provided around the second sectorial rectangular wires.

Figure 5:
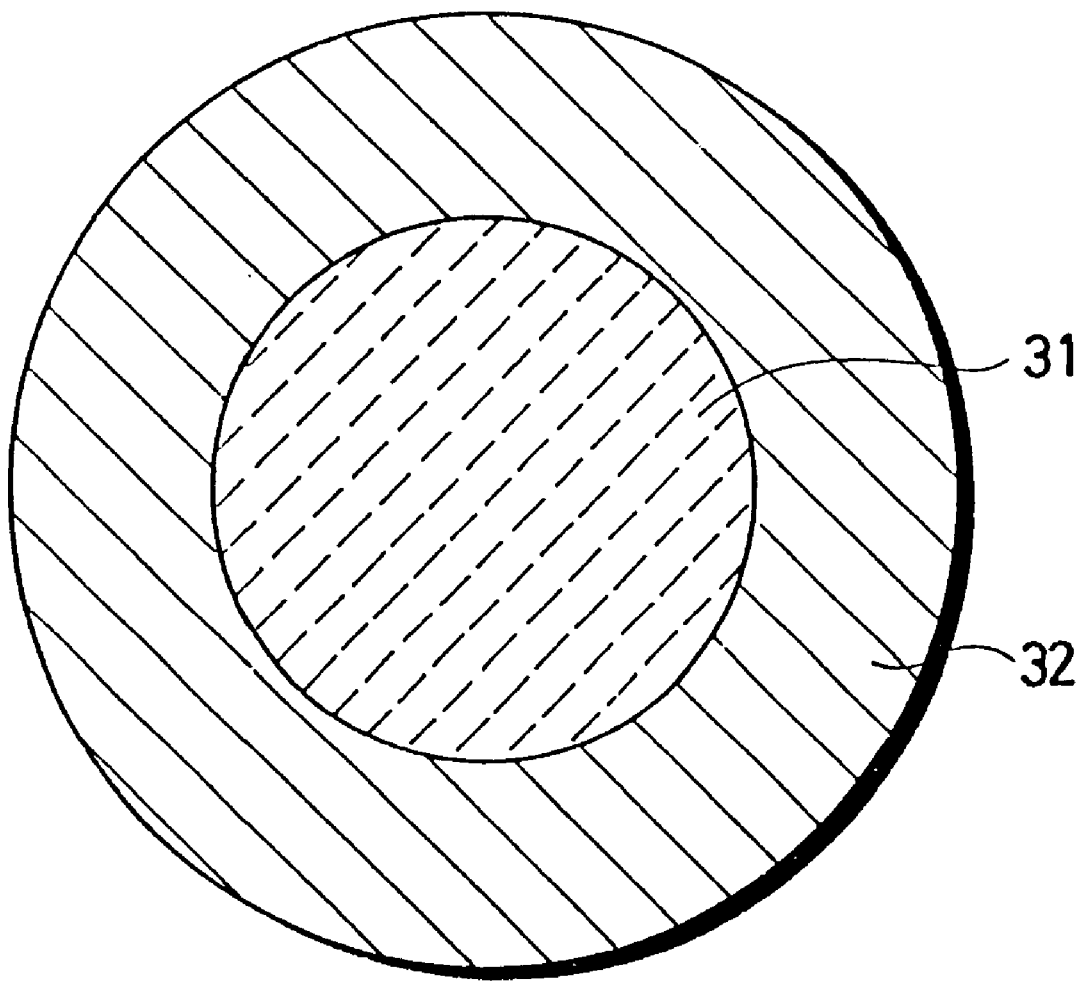
FIG. 5 is a sectional view showing a conventional superconducting wire prepared as reference example.

FIG. 5 shows a conventional superconducting wire which was prepared as reference example. Referring to FIG. 5, a central part was formed by an oxide superconductor 31, which was enclosed by a silver sheath 32. Such a conventional wire was drawn into a diameter of 3 mm, subjected to heat treatment similarly to the above Example, and again subjected to wire drawing. The wire drawing step was so carried out that the sectional area of the superconductor 31 was equal to the total sectional area of the oxide superconducting layers 21 shown in FIG. 4. Consequently, the diameter was 1.5 mm.

Critical current density values of Example 3 and the reference example were measured at a temperature of 77.3 K. The wire according to Example 3 exhibited critical current density of 8000 to 14000 $A/cm^2$, while the reference example exhibited critical current density of about 1000 $A/cm^2$.

Alternating currents of 60 Hz were fed to these wires to measure ac losses. The wire according to Example 3 exhibited an ac loss of about ten to scores of percent as compared with the reference example. Thus, it has been confirmed that the inventive wire exhibited a smaller loss when carrying ac.

According to this mode, as hereinabove described, the oxide superconducting layer for enclosing the central part is divided into a plurality of layers along the longitudinal direction, whereby the interfaces between the matrix layers and the oxide superconducting layers as well as the pinning points are increased to improve pinning force. Thus, the superconducting wire according to this mode exhibits higher critical current density as compared with the conventional wire.

According to the preferred mode of the present invention, as hereinabove described with reference to Example 3, the high-resistance layers are interposed between the oxide superconducting layers so as to reduce the coupled current flowing between the oxide superconducting layers. Thus, it is possible to reduce the loss caused when carrying ac.

Since the oxide superconducting layers are provided around the central part in the superconducting wire according to this Example, it is possible to apply compression stress to the oxide superconducting layers in plastic working of the wire to orient the crystals of the oxide superconductor in a direction for facilitating the flow of the current by preparing the central part from a material which is unworkable as compared with the material for the oxide superconducting layers. Thus, the critical current density can be further increased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of producing an oxide superconducting wire, comprising the steps of:
   arranging a metal sheath around a solid central metal rod having a longitudinal direction and a circumferential direction;
   providing a plurality of oxide superconducting segments circumferentially arranged around said central rod wherein each segment is circumferentially separated from its immediately adjacent segment, and wherein each segment has a configuration being elongated along the circumferential direction as compared with a radial direction on a cross section of said oxide superconducting segment;
   plastically working said oxide superconducting segments in a direction perpendicular to the circumferential direction, whereby particular crystallographic planes of crystal grains in said segments become oriented along the circumferential and longitudinal direction of said central metal rod.

2. The method of producing an anisotropic oxide superconducting wire according to claim 1, further comprising a step of interposing high-resistance layers between said configurations.

3. The method of producing an anisotropic oxide superconducting wire according to claim 2, wherein said high-resistance layer is comprised of silver-palladium.

4. A method of producing anisotropic oxide superconducting wire according to claim 5, wherein more than one oxide superconducting layers are provided and arranged adjacent to each other in the radial direction.

5. The method of producing an anisotropic oxide superconducting wire according to claim 1, wherein said metal rod is comprised of nickel, and said metal sheath is comprised of silver.

6. A method of producing an oxide superconducting wire, comprising the steps of:
   arranging a metal sheath around a solid central metal rod having a longitudinal direction and a circumferential direction;
   providing a plurality of oxide superconducting segments circumferentially arranged around said central rod, each of said oxide superconducting segments being elongated along the circumferential direction as compared with a radial direction on a cross section of said oxide superconducting segment;
   plastically working said oxide superconducting segments in a direction perpendicular to the circumferential direction, whereby particular crystallographic planes of crystal grains in said oxide superconducting segments are oriented along the circumferential and longitudinal direction of said central metal rod.

7. The method of producing an anisotropic oxide superconducting wire according to claim 6, further comprising a step of interposing high-resistance layers between said oxide superconducting layers.

8. The method of producing an anisotropic oxide superconducting wire according to claim 6, wherein said high-resistance layer is comprised of silver-palladium.

9. The method of producing an anisotropic oxide superconducting wire according to claim 6, wherein said metal rod is comprised of nickel, and said metal sheath is comprised of silver.

10. A method for producing an oxide superconducting wire, the method comprising:
    providing a composite superconducting wire, the composite superconducting wire comprising:
       an elongated central metal core having a longitudinal direction and a circumferential direction;
       an elongated oxide superconducting segment positioned around the central metal core and along the longitudinal direction thereof; and
       a metal sheath surrounding the superconducting segment, the metal sheath being more workable than the central metal core; and
    plastically working the composite superconducting wire in a direction perpendicular to the circumferential direction, whereby particular crystallographic planes of crystal grains in the oxide superconducting segment are oriented along the circumferential and the longitudinal direction of the central metal core and whereby specific crystal axes of the crystal grains in the oxide superconducting segment are oriented toward the central metal core in a radial direction thereof.

11. The method for producing an oxide superconducting wire of claim 10, wherein the plastic working is carried out so that the metal sheath has a larger reduction of area than that of the central metal core.

12. The method for producing an oxide superconducting wire of claim 10, wherein the metal sheath comprises a material that is more workable than that of the central metal core.

* * * * *

UNITED STATES PATENT AND TRADEMARK OFFICE
CERTIFICATE OF CORRECTION

PATENT NO.     : 6,357,105 B1
DATED          : March 19, 2002
INVENTOR(S)    : Hikata et al.

It is certified that error appears in the above-identified patent and that said Letters Patent is hereby corrected as shown below:

<u>Title page,</u>
Item [62], please change the filing date of the prior application 07/981,580 from "November 20, 1992" to -- November 25, 1992 --.

Signed and Sealed this

First Day of October, 2002

*Attest:*

*Attesting Officer*

JAMES E. ROGAN
*Director of the United States Patent and Trademark Office*